(12) United States Patent
Okumura et al.

(10) Patent No.: US 7,262,477 B2
(45) Date of Patent: Aug. 28, 2007

(54) SEMICONDUCTOR DEVICE

(75) Inventors: Hideki Okumura, Yokohama (JP);
Hitoshi Kobayashi, Yokohama (JP);
Masanobu Tsuchitani, Kawasaki (JP);
Akihiro Osawa, Himeji (JP); Satoshi Aida, Kawasaki (JP); Shigeo Kouzuki, Kawasaki (JP); Masaru Izumisawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 226 days.

(21) Appl. No.: 10/694,903

(22) Filed: Oct. 29, 2003

(65) Prior Publication Data

US 2004/0140521 A1  Jul. 22, 2004

Related U.S. Application Data

(63) Continuation-in-part of application No. 10/421,919, filed on Apr. 24, 2003, now abandoned.

(30) Foreign Application Priority Data

Apr. 30, 2002  (JP) .............................. 2002-127841

(51) Int. Cl.
*H01L 21/8238* (2006.01)
*H01L 29/00* (2006.01)

(52) U.S. Cl. .................. 257/510; 257/513; 257/341; 257/327; 257/330; 257/304

(58) Field of Classification Search ................ 257/758, 257/642, 3, 752, 632, 637, 634; 438/424
See application file for complete search history.

(56) References Cited

U.S. PATENT DOCUMENTS

| 4,544,576 | A |   | 10/1985 | Chu et al. |
| 4,942,076 | A | * | 7/1990 | Panicker et al. ............ 428/137 |
| 6,008,540 | A | * | 12/1999 | Lu et al. ..................... 257/758 |
| 6,322,600 | B1 | * | 11/2001 | Brewer et al. ................ 51/308 |
| 6,551,901 | B1 | * | 4/2003 | Gu et al. ..................... 438/424 |
| 6,566,243 | B2 | * | 5/2003 | Gaynor ....................... 438/622 |
| 6,653,718 | B2 | * | 11/2003 | Leung et al. ............... 257/634 |
| 2002/0182824 | A1 | * | 12/2002 | Lin et al. .................... 438/424 |

FOREIGN PATENT DOCUMENTS

JP           3-160746         7/1991

OTHER PUBLICATIONS

USPTO Co-pending U.S. Appl. No. 10/421,919.*
U.S. Appl. No. 10/694,903, filed Oct. 29, 2003, Okumura et al.
U.S. Appl. No. 10/983,658, filed Nov. 9, 2004, Tokano et al.
U.S. Appl. No. 10/694,903, filed Oct. 29, 2003, Okumura et al.
U.S. Appl. No. 11/117,331, filed Apr. 29, 2005, Kobayashi et al.

* cited by examiner

*Primary Examiner*—Sue A. Purvis
*Assistant Examiner*—Fazli Erdem
(74) *Attorney, Agent, or Firm*—Oblon, Spivak, McClelland, Maier & Neustadt, P.C.

(57) ABSTRACT

There is provided a semiconductor device including a semiconductor substrate with a trench, and a particulate insulating layer filling at least a lower portion of the trench and containing insulating particles. The semiconductor device may further include a reflowable dielectric layer covering an upper surface of the particulate insulating layer, the insulating particles being stable at the melting point or the softening point of the reflowable dielectric layer.

26 Claims, 9 Drawing Sheets

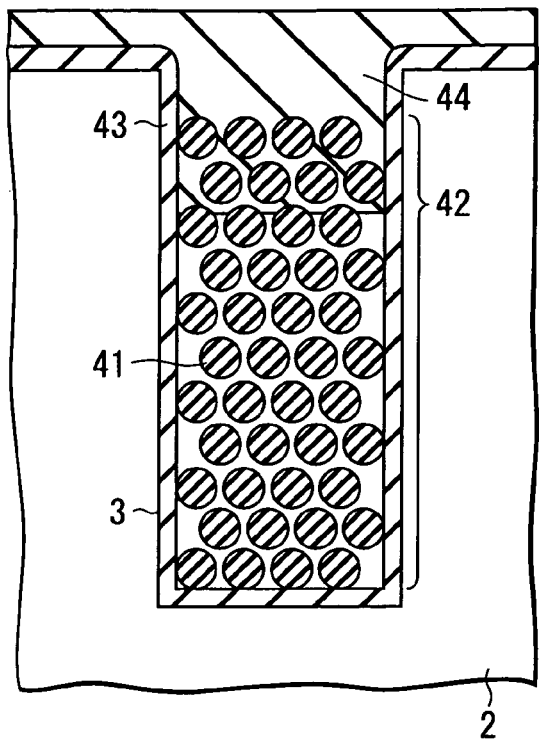 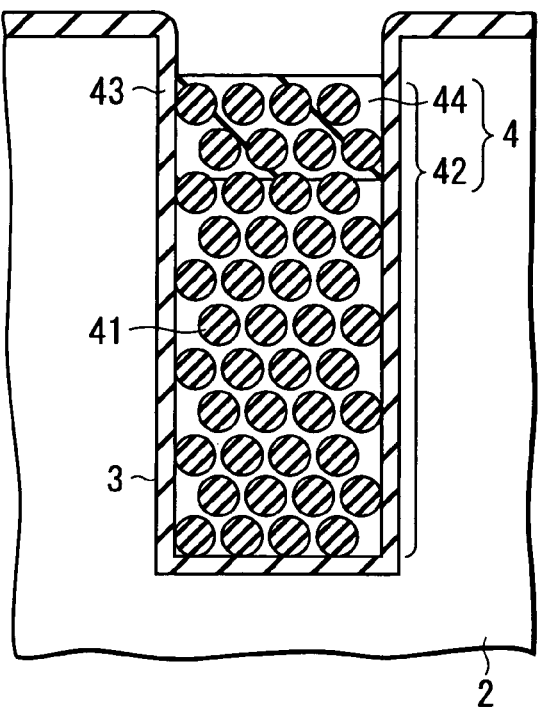
FIG. 17    FIG. 18
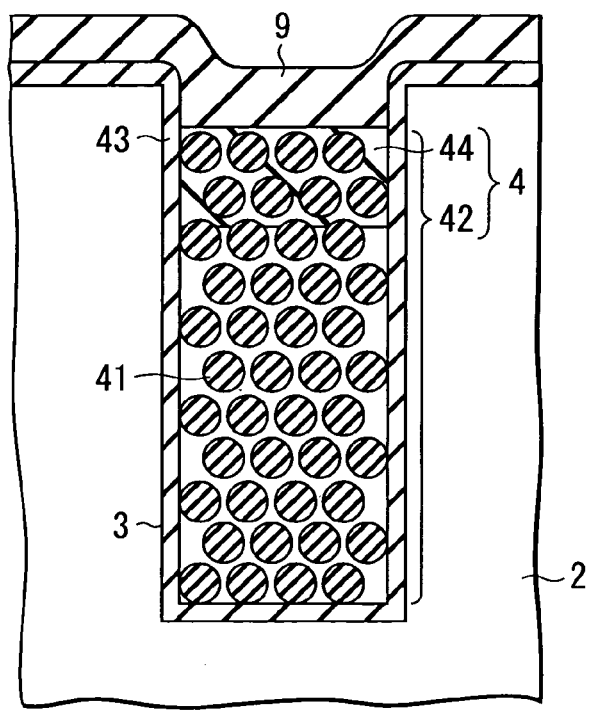
FIG. 19

SEMICONDUCTOR DEVICE

CROSS-REFERENCE TO RELATED APPLICATIONS

This is a Continuation-in-Part application of U.S. patent application Ser. No. 10/421,919, filed Apr. 24, 2003, now abandoned, the entire contents of which are incorporated herein by reference.

This application is based upon and claims the benefit of priority from the prior Japanese Patent Application No. 2002-127841, filed Apr. 30, 2002, the entire contents of which are incorporated herein by reference.

BACKGROUND OF THE INVENTION

1. Field of the Invention

The present invention relates to a semiconductor device, particularly, a semiconductor device utilizing trench isolation.

2. Description of the Related Art

Trench isolation is utilized in many cases in the field of semiconductor devices. For example, trench isolation is utilized for isolating metal oxide semiconductor (MOS) transistors or bipolar transistors.

In trench isolation technique, a trench (or groove) is formed by a selective etching method in a semiconductor substrate such as a silicon substrate, followed by filling the trench with an insulating material such as silicon oxide. For example, a mask material layer such as a silicon nitride layer or a silicon oxide layer is formed first on a semiconductor substrate, followed by patterning the mask material layer. Next, a surface region of the semiconductor substrate is etched by using the patterned mask material layer as an etching mask so as to form a trench in the semiconductor substrate. Then, an insulating material layer such as a silicon oxide layer is formed on the semiconductor substrate by, for example, a chemical vapor deposition (CVD) method or a solution coating method so as to bury the insulating material in the trench. Further, the surface on the side of the insulating layer is planarized by, for example, a dry etching method or a chemical mechanical polishing (CMP) method, thereby forming an isolating region.

It should be noted that a gigantic trench is formed in some cases in a semiconductor device such as a power MOS field effect transistor (FET). For example, in some cases, a gigantic trench having a width in the range of 3 μm to 15 μm and a depth in the range of 20 μm to 70 μm is formed.

Where the trench is relatively small, an insulating material can be buried in the trench by, for example, a CVD method. However, it is difficult to employ a CVD method for burying an insulating material in a gigantic trench.

In a solution coating method, the surface of a semiconductor substrate is coated, for example, by a spin coating method with a solution prepared by dissolving silanol etc. in an organic solvent, i.e., Spin On Glass (SOG), followed by baking the coating film so as to bury an SOG layer in the trench. The solution coating method is suitable for burying an insulating material in a larger trench, compared with the CVD method. However, SOG is low in viscosity, and it is necessary to repeat the coating treatment many times for forming an insulating layer buried in a gigantic trench. Also, even if the gigantic trench can be filled with the SOG layer, a problem tends to be arise in that a defect such as cracking occurs in the SOG layer when heat treatment such as an activating annealing treatment is performed.

It is disclosed in U.S. Pat. No. 4,544,576 that a trench formed in a silicon substrate is filled with a suspension containing glass particles, followed by applying heat treatment at a temperature high enough to fuse the glass particles so as to form a continuous glass layer. This method is considered to make it possible to fill a gigantic trench with an insulating material. However, in order to suppress the occurrence of defects in this method, it is necessary to use glass having a thermal expansion coefficient substantially equal to that of the silicon substrate. In other words, it is difficult to select the material used for forming the isolating region in view of, for example, the insulating properties.

BRIEF SUMMARY OF THE INVENTION

According to a first aspect of the present invention, there is provided a semiconductor device, comprising a semiconductor substrate with a trench, a particulate insulating layer filling at least a lower portion of the trench and comprising insulating particles, and a reflowable dielectric layer covering an upper surface of the particulate insulating layer, the insulating particles being stable at a melting point or a softening point of the reflowable dielectric layer.

According to a second aspect of the present invention, there is provided a semiconductor device, comprising a semiconductor substrate with a trench, and a particulate insulating layer filling at least a lower portion of the trench and comprising first and second insulating particles, an average diameter of the second insulating particles being smaller than an average diameter of the first insulating particles.

According to a third aspect of the present invention, there is provided a semiconductor device, comprising a semiconductor substrate with a trench, and a particulate insulating layer filling at least a lower portion of the trench and comprising insulating particles and an insulating binder that bonds the insulating particles together, the insulating particles and the insulating binder forming a network structure.

According to a fourth aspect of the present invention, there is provided a semiconductor device, comprising a semiconductor substrate with a trench, and a particulate insulating layer filling at least a lower portion of the trench and including first and second particulate insulating layers, the first particulate insulating layer comprising first insulating particles with no binder, and the second particulate insulating layer covering an upper surface of the first particulate insulating layer and comprising second insulating particles and an insulating binder.

BRIEF DESCRIPTION OF THE SEVERAL VIEWS OF THE DRAWING

FIGS. 17 to 19 are cross-sectional views schematically exemplifying a method of forming the construction shown in FIG. 13.

DETAILED DESCRIPTION OF THE INVENTION

Figure 1:
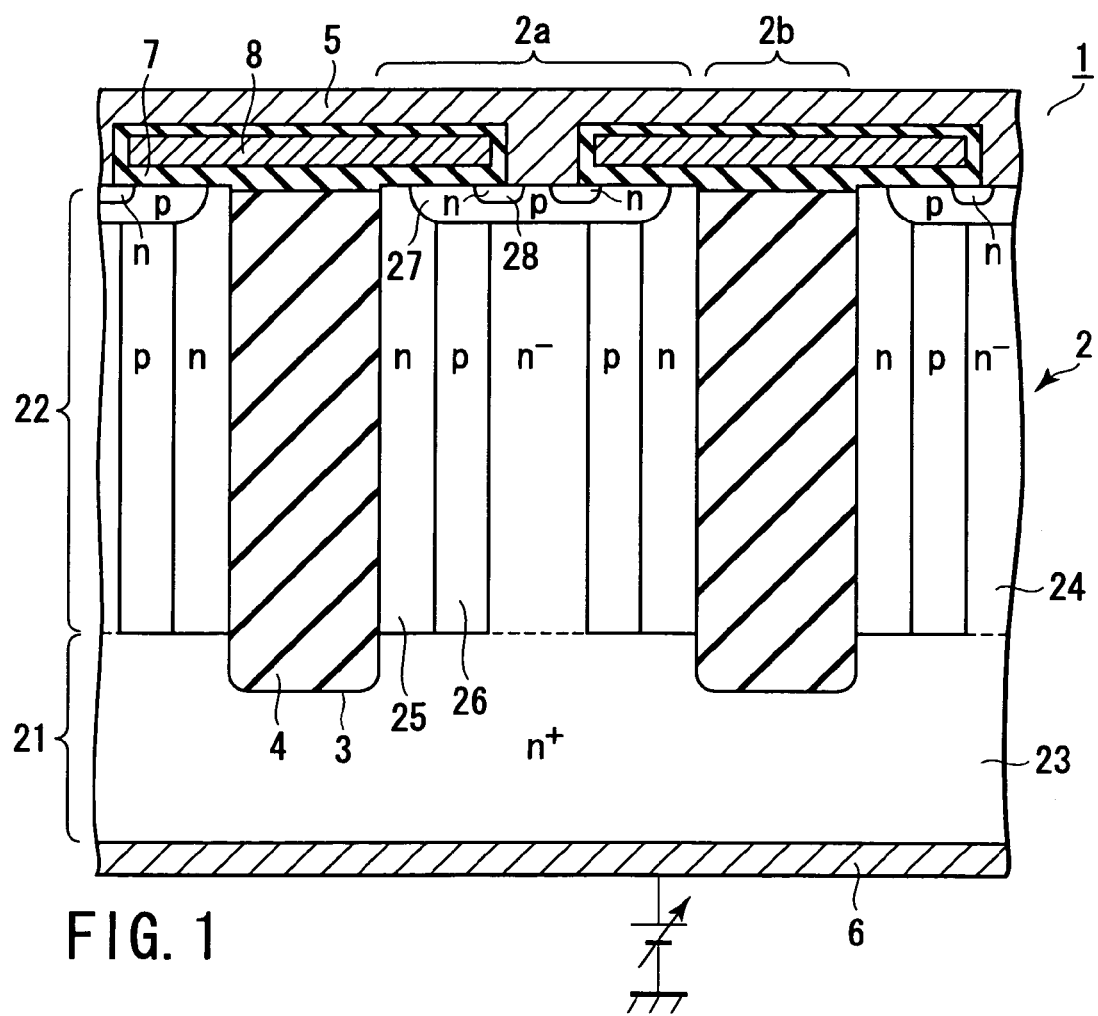
FIG. 1 is a cross-sectional view schematically showing a semiconductor device according to a first embodiment of the present invention.

Embodiments of the present invention will now be described with reference to the accompanying drawings. Throughout the drawings, the constituents performing the same or similar functions are denoted by the same reference numerals so as to avoid overlapping description.

Figure 2:
FIG. 2 is a plan view schematically showing the semiconductor substrate included in the semiconductor device shown in FIG. 1.

FIG. 1 is a cross-sectional view schematically showing a semiconductor device according to a first embodiment of the present invention, and FIG. 2 is a plan view schematically showing the semiconductor substrate included in the semiconductor device shown in FIG. 1.

A semiconductor device 1 shown in FIG. 1 includes a vertical power MOSFET. The semiconductor device 1 has a semiconductor substrate 2. As shown in FIG. 2, a device region 2a and device isolating regions 2b are formed on a main surface of the semiconductor substrate 2. These device isolating regions 2b correspond to trenches 3 formed in the semiconductor substrate shown in FIG. 1 or to insulating layers 4 filling these trenches 3. Each trench 3 has a width in the range of, for example, 3 μm to 15 μm, and a depth in the range of, for example, 20 μm to 70 μm.

A source electrode 5 is formed as a common electrode on the upper surface of the semiconductor substrate 2. On the other hand, a drain electrode 6 is formed as a common electrode on the lower surface of the semiconductor substrate 2. In other words, the semiconductor device 1 shown in FIG. 1 permits the drain current to flow in the thickness direction of the semiconductor substrate 2, i.e., in the vertical direction in the drawing.

The semiconductor substrate 2 includes a first semiconductor layer 21 of a first conductivity type, i.e., $n^+$ type conductivity in this case, that is utilized as a drain region 23 of a high impurity concentration. The semiconductor substrate 2 further includes a second semiconductor layer 22 of the first conductivity type, i.e., $n^-$ type conductivity in this case, that has an impurity concentration lower than that of the first semiconductor layer 21. The first semiconductor layer 21 is, for example, a silicon substrate, and the second semiconductor layer 22 is, for example, a silicon layer formed on the first semiconductor layer 21 by an epitaxial growth method.

The trenches 3 are formed in the semiconductor substrate 2, and each of these trenches 3 is filled with the insulating layer 4. An impurity diffusion region 25 of the first conductivity type, i.e., n-type in this case, is formed in a surface region of the semiconductor substrate 2 that is positioned adjacent to the side surface of the insulating film 4. Also, an impurity diffusion layer 26 of a second conductivity type, i.e., p-type, is formed in a region of the semiconductor substrate 2 that is positioned adjacent to the impurity diffusion region 25. These impurity diffusion regions 25 and 26 are obtained by introducing an impurity into the semiconductor substrate 2 from the sidewall of the trench 3 before the insulating film 4 is buried in the trench 3, followed by diffusing and activating the impurity within the semiconductor substrate 2.

A base region 27 of the second conductivity type, i.e., p-type, is formed in the surface region of the semiconductor substrate 2 that is positioned on the side of the source electrode 5. A source region 28 of the first conductivity type, i.e., n-type, is formed within the base region 27 by, for example, an impurity diffusion method.

A gate electrode 8 is formed on that surface of the semiconductor substrate 2, in which the source region 28 is formed, with a gate insulating film 7 interposed between the gate electrode 8 and the surface of the semiconductor substrate 2. Each gate electrode 8 is positioned to face at least the portion of the semiconductor substrate 2 that extends between a pair of adjacent source regions 28 sandwiching the insulating layer 4. Also, in each device region 2a, the source electrode 5 is connected to a pair of source regions 28 and base region 27 sandwiched between the adjacent insulating layers 4.

In the first embodiment of the present invention, the construction described below is employed in the insulating layer 4 included in the semiconductor device 1 shown in FIG. 1.

Figure 3:
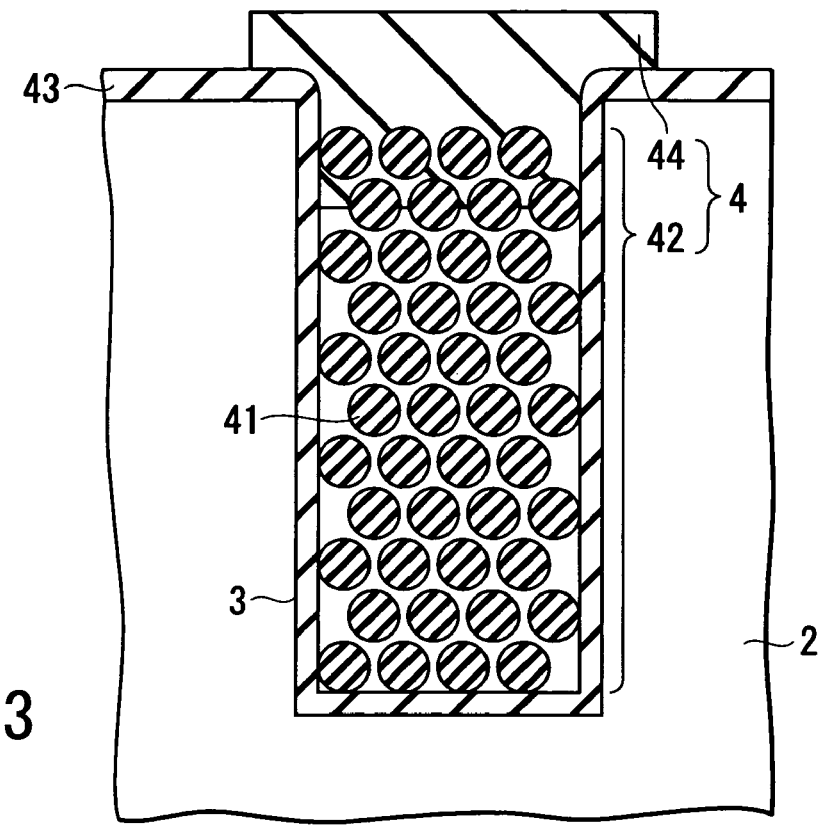
FIG. 3 is a cross-sectional view schematically showing a construction that can be employed in the semiconductor device according to the first embodiment of the present invention.

FIG. 3 is a cross-sectional view schematically showing a construction that can be employed in the semiconductor device according to the first embodiment of the present invention. In the construction shown in FIG. 3, insulating particles 41 are contained in the insulating layer 4. Many insulating particles 41 are not bonded to each other and, typically, are not bonded to the sidewall or the bottom surface of the trench 3. Also, the insulating particles form a particulate insulating layer 42 within the trench 3.

In the case of employing this particular construction, it is possible for the insulating particles 41 to migrate within the trench 3 in accordance with the expansion or shrinkage of the semiconductor substrate 2 and/or the insulating particles 41. As a result, where the semiconductor substrate 2 is subjected to heat treatment such as an activating annealing treatment, it is possible to prevent a large stress from being applied to the semiconductor substrate 2 even if the semiconductor substrate 2 and/or the insulating particles 41 expand or shrink. It follows that it is possible to suppress the occurrence of defects such as the crack within the semiconductor substrate 2, which may be caused by the heat treatment.

It should also be noted that the particulate insulating layer 42 can be formed easily even if the trench 3 is gigantically large. To be more specific, prepared is a suspension by dispersing the insulating particles 41 in a dispersion medium such as an organic solvent. Then, that surface of the semiconductor substrate 2 in which the trench 3 is formed is coated with the suspension, followed by removing the dispersion medium from the coating film. As a result, the trench 3 is filled with the insulating particles 41. In other words, the particulate insulating layer 42 is obtained.

In the method described above, it is possible to form the coating film by, for example, a spin coating method. In the case of employing the particular method, a significantly large difference is not generated between the thickness of the coating film obtained by the coating of the suspension and the thickness of the particulate insulating layer 42. Further, in the case of using the insulating particles 41 having a relatively large particle diameter, the sedimentation of the insulating particles 41 readily takes place, with the result that those insulating particles 41 within the coating film which are positioned inside the trench 3 are unlikely to be discharged to the outside of the trench 3 during the spin coating operation. It follows that, even if the trench 3 is gigantically large, it is possible to form easily the particulate insulating layer 42 having a sufficiently large thickness by, for example, a single coating operation.

It should also be noted that, in the construction shown in FIG. 3, the insulating layer 4 also includes a reflowable dielectric layer 44. The reflowable dielectric layer 44 is positioned to fill an upper portion of the trench 3. The melting point or the softening point of the reflowable dielectric layer 44 falls within a temperature range within which the insulating particles 41 can be present stably, i.e., the temperature range within which the fusion of the insulating particles 41 and/or the bonding of the insulating particles 41 do not take place.

As described above, the insulating particles 41 are not bonded to each other and are not bonded to any of the sidewall and the bottom surface of the trench 3. As a result, it is possible for the insulating particles 41 to be released from within the trench 3 in any stage of the manufacturing process unless the opening of the trench 2 is closed. The insulating particles released from within the trench 3 are equivalent to dust and, thus, it is possible for the yield to be lowered.

On the other hand, if the reflowable dielectric layer 44 is formed on the particulate insulating layer 42, the insulating particles 41 are prevented from being released from within the trench 3. Also, it is possible for the reflowable dielectric layer 44 to be softened or melted when heat treatment such as an activating annealing treatment is performed. Therefore, the reflowable dielectric layer 44 does not cause a large stress to be applied to the semiconductor substrate 2. It follows that, according to the construction shown in FIG. 3, it is possible to suppress the release of the insulating particles 41 from within the trench 3 and to suppress the occurrence of defects such as a crack in the semiconductor substrate 2, which may be caused by the heat treatment.

Incidentally, it is possible for the reflowable dielectric layer 44, which is melted or softened during the heat treatment, to permeate into the particulate insulating layer 42. It follows that it is possible for the particulate insulating layer 42 and the reflowable dielectric layer 44 to partially overlap with each other.

Further, in the construction shown in FIG. 3, a barrier insulating layer 43 is formed to cover the sidewall and the bottom surface of the trench 3. In general, the wettability of the silicon substrate with an organic solvent is not high. If the barrier insulating layer 43 is formed, however, it is possible to control the wettability of the sidewall and the bottom surface of the trench 3 with an organic solvent. As a result, the particulate insulating film 42 can be formed more easily. Also, if the barrier insulating layer 43 is formed, it is possible to suppress the diffusion of an impurity from the reflowable dielectric layer 44 into the semiconductor substrate 2.

An experiment was conducted as follows as an example of the first embodiment of the present invention. First, the silicon substrate 2 was coated with a colloidal silica by a spin coating method, followed by heating the resultant coating film so as to remove the dispersion medium from the coating film. As a result, a particulate insulating layer 42 containing silica particles 41 having an average particle diameter of 0.3 μm was formed. Incidentally, silicon has a thermal expansion coefficient of $4.1 \times 10^{-6}/°$ C., and silicon oxide has a thermal expansion coefficient of about $23 \times 10^{-6}/°$ C. Then, the silica particles 41 attached to the outside of the trench 3 were removed by a CMP treatment. By this CMP treatment, the upper portion of the particulate insulating layer 42 within the trench 3 was peeled off so as to decrease the thickness of the particulate insulating layer 42 by about 2 μm to 5 μm. The upper portion of the trench 3 was filled with a BPSG (Boro-Phospho Silicate Glass) film forming a reflowable dielectric layer 44. Incidentally, BPSG is a material prepared by adding $B_2O_3$ and at least one of $P_2O_5$ and $P_2O_3$ to $SiO_2$. The resultant structure was subjected to a heat treatment at 1,100° C. for 8 hours under a nitrogen gas atmosphere. As a result, a defect did not occur in the portion of the silicon substrate 2 that is positioned in the vicinity of the trench 3, although cracks were formed in the particulate insulating layer 42. Also, the silica particles 41 were not diffused to the outside of the trench 3 after formation of the reflowable dielectric layer 44.

For comparison, an additional experiment was conducted as follows. First, a silicon oxide film was formed on the silicon substrate 2 by a CVD method. The silicon oxide film was formed on the device region 2a in a thickness equal to or larger than 5 μm. Then, that portion of the silicon oxide film which was positioned outside the trench 3 was removed by a CMP treatment. The resultant structure was subjected to a heat treatment at 1,100° C. for 8 hours under a nitrogen gas atmosphere. As a result, a defect occurred in the portion of the silicon substrate 2 that is positioned in the vicinity of the trench 3.

As a material of the insulating particles 41, it is possible to use, for example, silica, titania, zirconia, a carbide such as silicon carbide and a mixture thereof. Many of these materials are high in the insulating property, excellent in the heat-resistant property, and have a thermal expansion coefficient larger than or substantially equal to that of the semiconductor substrate 2.

It is possible for the insulating particles 41 to have an average particle diameter of, for example, 100 nm or more. Also, it is possible for the insulating particles 41 to have an average particle diameter of 500 nm or less or an average particle diameter not larger than half the width of the opening of the trench 3.

In the case of using a colloidal silica as a material of the insulating particles 41, the silica particles, if subjected to heat treatment under a high temperature, shrink by about 5% to 15%. The shrinkage ratio differs depending on the particle diameter of silica. To be more specific, silica particles having a large particle diameter have a small shrinkage ratio, and silica particles having a small particle diameter have a large shrinkage ratio. In general, silica particles having an average particle diameter not smaller than 100 nm have a sufficiently small shrinkage ratio. However, it is difficult in many cases to manufacture a monodisperse colloidal silica when it comes to silica particles having an average particle diameter exceeding 500 nm.

The trench 3 having a width of 5 µm and a depth not smaller than 50 µm was actually filled with a colloidal silica. In the case of using a colloidal silica in which the silica particles had an average particle diameter of 50 nm, the yield of the burying process was not higher than 10%. On the other hand, additional experiments were conducted by using a colloidal silica in which the silica particles had an average particle diameter of 150 nm and 300 nm, respectively. The yield of the burying process was not lower than 90% in each of these cases.

It is possible to use the insulating particles 41 having a melting point or a softening point higher than the highest temperature in the heat treatment applied after formation of the particulate insulating layer 42. For example, it is possible to use the insulating particles 41 having a melting point or a softening point higher than 1,100° C. Typically, use is made of the insulating particles 41, which are stable even at the highest temperature in the heat treatment applied after formation of the particulate insulating layer 42, i.e., the insulating particles which are not melted or bonded at the highest temperature noted above.

As the material of the reflowable dielectric layer, it is possible to use materials having a melting point or a softening point in the temperature range within which the insulating particles 41 can be present stably, i.e., the temperature range within which the fusion of the insulating particles 41 and/or the bonding of the insulating particles 41 do not take place. Typically, use is made of the reflowable dielectric layer 44, which has a melting point or a softening point lower than the highest temperature in the heat treatment applied after formation of the particulate insulating layer 42. The material meeting the particular requirement includes, for example, a silicate glass with an impurity added thereto such as BPSG, BSG (Boro-Silicate Glass) and PSG (Phospho Silicate Glass).

The thickness of the reflowable dielectric layer 44 is not particularly limited, though the reflowable dielectric layer 44 is generally formed to have a thickness at least three times the average particle diameter of the insulating particles 41 that constitute the particulate insulating layer 42 below the reflowable dielectric layer 44. For example, it is possible for the thickness of the reflowable dielectric layer 44 to fall within a range of about 1 µm to about 4 µm.

The material of the barrier insulating layer 43 includes, for example, silicon oxide, silicon nitride and a mixture thereof. It is possible to form the barrier insulating layer 43 by, for example, a CVD method such as a LP (Low Pressure) CVD method or a thermal oxidation method.

The dispersion medium of the suspension used for forming the particulate insulating layer 42 includes, for example, an organic solvent such as alcohols, polyhydric alcohols, ethers, esters, ketones, and a mixture thereof. The alcohols include, for example, ethanol, isopropanol and cyclohexanol. The polyhydric alcohols include, for example, ethylene glycol, diethylene glycol and polypropylene glycol. The ethers include, for example, a glycol ether such as propylene glycol ether. The esters include, for example, ethyl acetate. Further, the ketones include, for example, cyclohexanone and butyrolactone.

A second embodiment of the present invention will now be described. The second embodiment is substantially equal to the first embodiment described above, except that the construction described below is employed in the insulating layer 4.

Figure 4:
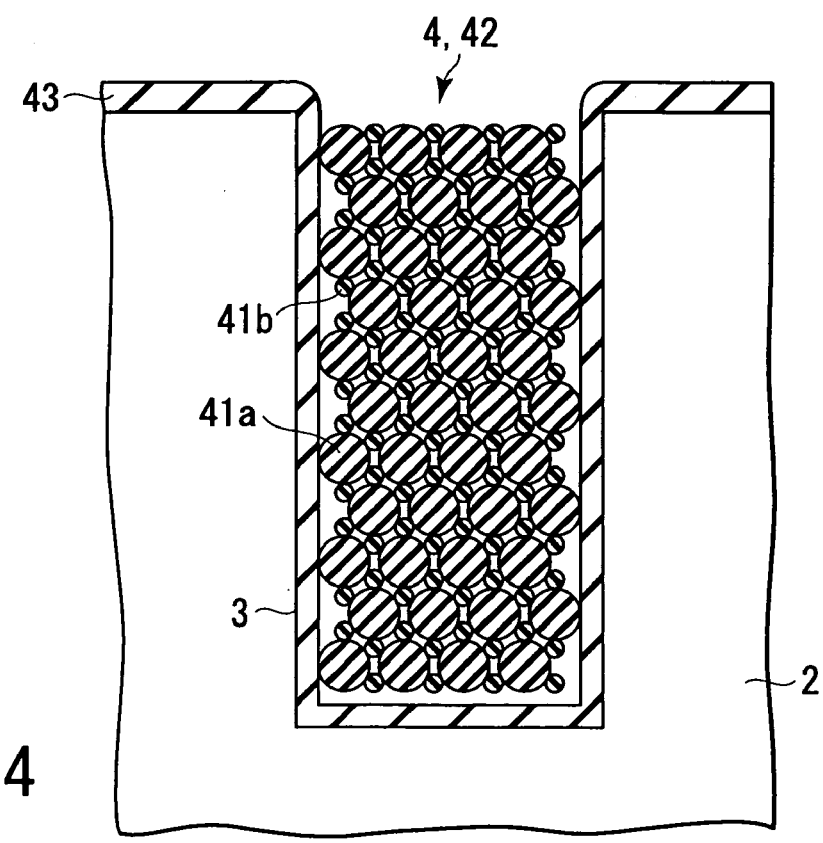
FIG. 4 is a cross-sectional view schematically exemplifying a construction that can be employed in a semiconductor device according to a second embodiment of the present invention.

FIG. 4 is a cross-sectional view schematically showing the construction that can be employed in a semiconductor device according to the second embodiment of the present invention. In the construction shown in FIG. 4, the insulating layer 4 is formed of a particulate insulating layer 42. The particulate insulating layer 42 contains first insulating particles 41a having a larger average particle diameter and second insulating particles 41b having a smaller average particle diameter. These first and second insulating particles 41a and 41b are mixed substantially uniformly within the particulate insulating layer 42.

As in the first embodiment described previously, it is possible to suppress the defect generation such as a crack occurrence in the semiconductor substrate 2, which may be caused by the heat treatment, in the second embodiment of the present invention, too. Also, as in the first embodiment, it is possible to form easily the particulate insulating layer 42 even if the trench 3 is gigantically large in the second embodiment, too. Further, in the second embodiment of the present invention, the first and second insulating particles 41a and 41b are contained in the particulate insulating layer 42 so as to produce a feature as described below.

It should be noted that the first insulating particles 41a having a larger average particle diameter permit forming easily the particulate insulating layer 42 in a large thickness. However, if the particulate insulating layer 42 is formed of the first insulating particles 41a alone having a larger average particle diameter, it is difficult in many cases to obtain the particulate insulating layer 42 excellent in flatness.

In the second embodiment of the present invention, however, the second insulating particles 41b having a smaller average particle diameter are used together with the first insulating particles 41a having a larger average particle diameter, as described above. It should be noted that the second insulating particles 41b having a smaller average particle diameter plays the role of improving the flatness of the particulate insulating layer 42. It follows that the second embodiment of the present invention makes it possible to form easily the particulate insulating layer 42 excellent in the flatness in a sufficiently large thickness.

In the second embodiment of the present invention, it is possible to use as the materials of the first and second insulating particles 41a and 41b the materials exemplified previously in conjunction with the insulating particles 41 used in the first embodiment. It is possible for the material of the first insulating particles 41a and the material of the second insulating particle 41b to be equal to or different from each other.

It is possible for the first insulating particles 41a to have an average particle diameter not smaller than, for example, 100 nm. Also, it is possible for the first insulating particles 41a to have an average particle diameter not larger than 500 nm or to have an average particle diameter not larger than half the width of the opening of the trench 3. It suffices for the second insulating particles 41b to have an average particle diameter smaller than the average particle diameter of the first insulating particles 41a. To be more specific, it is possible for the average particle diameter of the second insulating particles 41b to be smaller than 100 nm. For example, it is possible to use in combination the first insulating particles 41a having an average particle diameter of 400 nm and the second insulating particles 41b having an average particle diameter of 70 nm. Typically, the first insulating particles 41a having an average particle diameter falling within a range of between 250 nm and 350 nm are used in combination with the second insulating particles 41b having an average particle diameter falling within a range of between 125 nm and 175 nm.

It is possible for the particulate insulating layer 42 to further contain at least one kind of additional insulating particles differing from any of the first and second insulating particles 41a and 41b in the average particle diameter. Incidentally, the construction that the particulate insulating layer 42 contains a plurality of groups of insulating particles differing from each other in the average particle diameter can be recognized in the case where the particle size distribution has a plurality of peaks. Also, even in the case where the particle size distribution has only one peak, it is possible to confirm that the particulate insulating layer 42 contains a plurality of groups of insulating particles differing from each other in the average particle diameter, if a plurality of kinds of insulating particles differing from each other in the material are used for forming the particulate insulating layer 42, by obtaining the average particle diameter of the insulating particles for each material.

An experiment was conducted as follows as an example of the second embodiment of the present invention. First, the surface of the semiconductor substrate 2 was coated with a colloidal silica by a spin coating method, followed by heating the resultant coating film so as to remove the dispersion medium from the coating film. In this case, used was a mixture of two kinds of colloidal silica differing from each other in the average particle diameter of the silica particles. As a result, a particulate insulating layer 42 containing silica particles 41a having an average particle diameter of 0.3 µm and silica particles 41b having an average particle diameter of 0.15 µm was formed. Then, the silica particles 41 attached to the outside of the trench 3 were removed by applying a CMP treatment. A heat treatment was applied to the resultant structure at 1,100° C. for 8 hours under a nitrogen gas atmosphere. As a result, a defect did not occur in the portion of the silicon substrate 2 that is positioned in the vicinity of the trench 3, although cracks occurred in the particulate insulating layer 42. Also, the surface of the particulate insulating layer 42 obtained in this experiment was found to be superior in the flatness to the surface of the particulate insulating layer 42 obtained in the experiment relating to the first embodiment of the present invention.

A third embodiment of the present invention will now be described. The third embodiment is substantially equal to the second embodiment, except that the particulate insulating layer formed of the first insulating particles 41a and the particulate insulating layer formed of the second insulating particles 41b were laminated one upon the other in the third embodiment in place of mixing the first insulating particles 41a and the second insulating particles 41b for forming the particulate insulating layer 42 as in the second embodiment.

Figure 5:
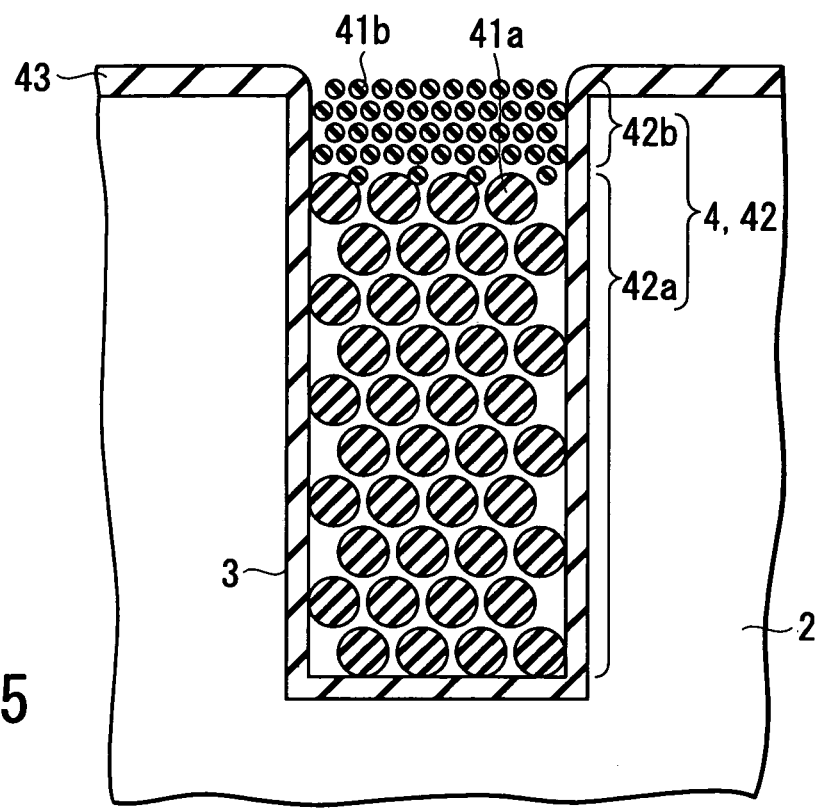
FIG. 5 is a cross-sectional view schematically exemplifying a construction that can be employed in a semiconductor device according to a third embodiment of the present invention.

FIG. 5 is a cross-sectional view schematically exemplifying a construction that can be employed in a semiconductor device according to a third embodiment of the present invention. In the construction shown in FIG. 5, the insulating layer 4 is formed of the particulate insulating layer 42. As shown in FIG. 5, the particulate insulating layer 42 includes a first particulate insulating layer 42a formed of the first insulating particles 41a and a second particulate insulating layer 42b formed of the second insulating particles 41b.

In the third embodiment of the present invention, the first particulate insulating layer 42a is formed of the first insulating particles 41a having a larger average particle diameter, and the second particulate insulating layer 42b formed of the second insulating particles having a smaller average particle diameter is formed on the first particulate insulating layer 41a. It is possible to form a particulate insulating layer 42 having an excellent flatness by employing the particular construction.

Incidentally, it is also possible to form the second particulate insulating layer 42b by using the second insulating particles 41b having a smaller average particle diameter, followed by forming the first particulate insulating layer 42a of the first insulating particles 41a having a larger average particle diameter on the second particulate insulating layer 42b. In other words, it is possible to reverse the laminating order of the first particulate insulating layer 42a and the second particulate insulating layer 42b. In this case, however, the flatness of the particulate insulating layer 42 is not so high as in the case where the first particulate insulating layer 42a and the second particulate insulating layer 42b are laminated one upon the other in the order shown in FIG. 5.

It is possible for the particulate insulating layer 42 to further include at least one additional particulate insulating layer differing from each of the first and second particulate insulating layers 42a and 42b in the average particle diameter of the insulating particles. In this case, the particulate insulating layer formed of the insulating particles having the smallest average particle diameter typically constitutes the uppermost layer of the particulate insulating layer 42. For example, the particulate insulating layers are laminated one upon the other in the order that permits the average particle diameter of the insulating particles to be increased in the depth direction of the particulate insulating layer 42.

An experiment was conducted as follows as an example of the third embodiment of the present invention. First, the surface of the silicon substrate 2 was coated by a spin coating method with a colloidal silica containing silica particles having a larger average particle diameter, followed by heating the coating film so as to remove the dispersion medium from the coating film. As a result, a particulate insulating layer 42a formed of the silica particles 41a having an average particle diameter of 0.3 µm was formed. Next, the silica particles 41a attached to the outside of the trench 3 were removed by a CMP treatment. Then, the silicon substrate 2 was coated by a spin coating method with a colloidal silica containing silica particles having a smaller average particle diameter, followed by heating the resultant coating film so as to remove the dispersion medium from the coating film. In this fashion, a particulate insulating film 42b formed of the silica particles 41b having an average particle diameter of 0.15 µm was formed. After formation of the particulate insulating layer 42b, the silica particles 41b attached to the outside of the trench 3 were removed by a CMP treatment. Heat treatment was applied to the resultant structure at 1,100° C. for 8 hours under a nitrogen gas atmosphere. As a result, a defect did not occur in the portion of the silicon substrate 2 that is positioned in the vicinity of the trench 3, although cracks occurred in the particulate insulating layer 42. Also, the surface of the particulate insulating layer 42 obtained in this experiment was found to be superior in the flatness to the surface of the particulate insulating layer 42 obtained inn the experiment conducted in conjunction with the second embodiment of the present invention.

A fourth embodiment of the present invention will now be described. The fourth embodiment is substantially equal to the first embodiment except that the construction described below was employed in the insulating layer 4.

Figure 6:
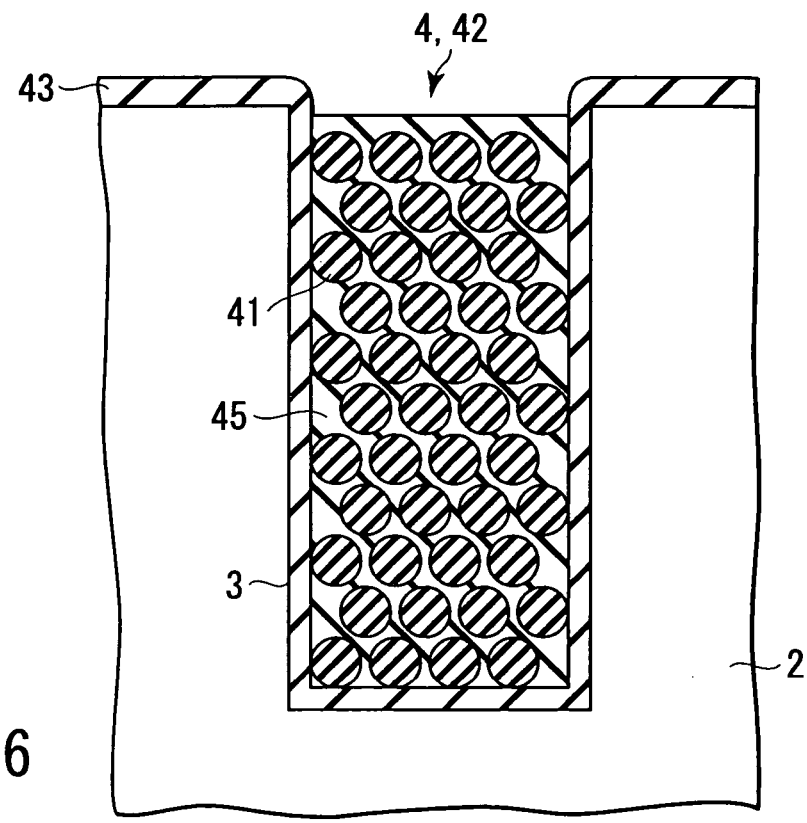
FIG. 6 is a cross-sectional view schematically exemplifying a construction that can be employed in a semiconductor device according to a fourth embodiment of the present invention.
Figure 7:
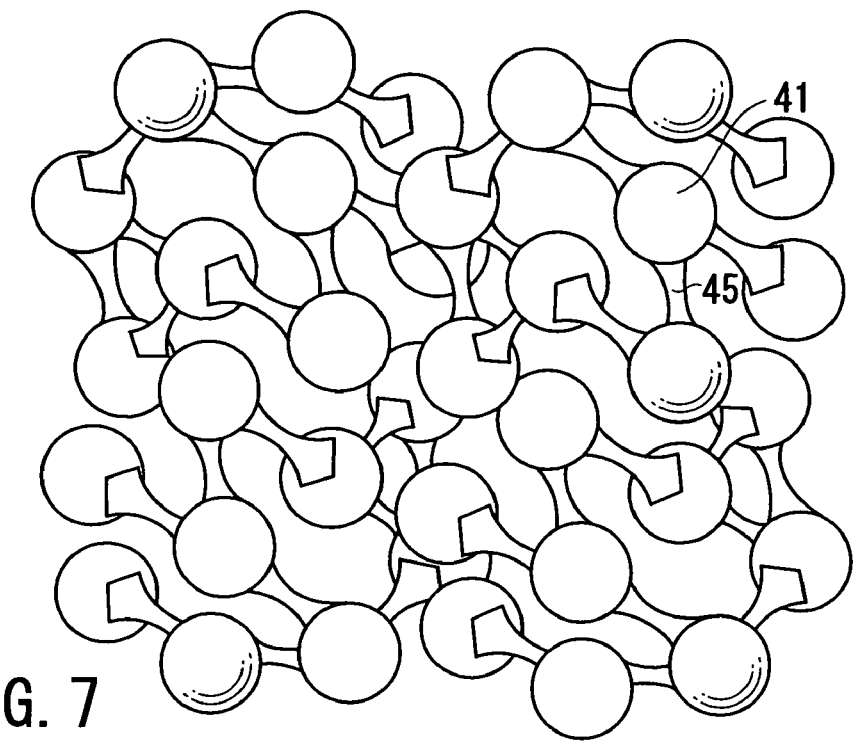
FIG. 7 shows in a magnified fashion the particulate insulating layer shown in FIG. 6.

FIG. 6 is a cross-sectional view schematically showing a construction that can be employed in a semiconductor device according to the fourth embodiment of the present invention. On the other hand, FIG. 7 shows in a magnified fashion the particulate insulating layer 42 shown in FIG. 6. In the construction shown in FIG. 6, the insulating layer 4 is formed of the particulate insulating layer 42. The particulate insulating layer 42 contains insulating particles 41 and an insulating binder 45 serving to bind these insulating particles 41. In other words, these insulating particles 41 and the insulating binder 45 collectively form a network structure as shown in FIG. 7.

As described previously in conjunction with the first embodiment of the present invention, a difficulty is generated in the case where the insulating particles 41 are not bonded to each other and not bonded to any of the sidewall and the bottom surface of the trench 3 unless the opening of the trench 3 is closed. Specifically, it is possible in this case for the insulating particles 41 to be diffused outward from within the trench 3 in any of the stages of the manufacturing process. In the fourth embodiment of the present invention, however, the insulating particles 41 are bonded to each other via the insulating binder 45 as described above with the result that it is possible to considerably suppress the diffusion of the insulating particles 41 from within the trench 3 to the outside even if the opening of the trench 3 is not closed.

Further, in the fourth embodiment of the present invention, a network structure is formed by the insulating particles 41 and the insulating binder. If a network structure is formed, the particulate insulating layer 42 tends to be deformed easily so as to moderate the stress derived from the change in temperature. Also, where an excessively high stress is applied, the insulating particles 41 are peeled from the insulating binder 45, or the insulating binder 45 is fractured, with the result that the stress is moderated. In addition, since the peeling or the fracture noted above generally takes place in only a part of the particulate insulating layer 42, dust due to the peeling or the fracture is scarcely generated. It follows that it is possible in the fourth embodiment of the present invention to prevent the insulating particles 41 from being released from within the trench 3 and to suppress the defect generation such as a crack occurrence in the semiconductor substrate 2, which may be caused by the heat treatment, as in the first embodiment of the present invention described previously.

Also, in the fourth embodiment of the present invention, the particulate insulating layer 42 can be formed easily even if the trench 3 is gigantically large, as in the first embodiment of the present invention. For example, a suspension containing the insulating particles 41, the material of the insulating binder 45, and a dispersion medium such as an organic solvent is prepared first. It is possible to use, for example, SOG as a material of the insulating binder 45. Then, that surface of the semiconductor substrate 2 on which the trench 3 is formed is coated with the suspension thus prepared, followed by subjecting the coating film to heat treatment at about, for example, 400° C. As a result, the dispersion medium is removed from the coating film and, at the same time, silanol is polymerized. In this fashion, the trench 3 is filled with the insulating particles 41 and the insulating binder 45 so as to form the particulate insulating layer 42.

In the method described above, the coating film can be formed by, for example, a spin coating method. Also, in the method described above, a significant difference between the thickness of the coating film obtained by the coating of the suspension and the thickness of the particulate insulating layer 42 does not occur. Further, in the case of using the insulating particles 41 having a relative large particle diameter, the sedimentation of the insulating particles 41 is facilitated, with the result that those portions of the insulating particles 41 contained in the coating film which are positioned within the trench 3 are rendered unlikely to be discharged to the outside of the trench 3 in the spin coating process. It follows that, even if the trench 3 is gigantically large, it is possible to form easily the particulate insulating layer 42 having a sufficiently large thickness by, for example, a single coating treatment.

Incidentally, the particulate insulating layer 42 in which the insulating particles 41 and the insulating binder 45 collectively form a network structure can be formed easily by, for example, setting low a ratio of the material of the insulating binder 45 to the insulating particles 41 within the suspension.

It is possible to use, for example, an SOG such as an inorganic SOG or an organic SOG, which is prepared by dissolving silanol as shown in chemical formulas given below in an organic solvent, as a material of the insulating binder 45. Incidentally, silanol used for preparing an inorganic SOG or an organic SOG is not limited to those shown in the chemical formulas given below. For example, it is possible for a part of the —OH groups and —O— groups bonded to the Si atom to be substituted by a —H group in the silanol used for preparing the inorganic SOG or the organic SOG. Also, it is possible for the —CH$_3$ group to be substituted by another alkyl group such as —C$_2$H$_5$ group in the silanol used for preparing the organic SOG. Further, it is possible for a part of the —OH groups and the —O— groups bonded to the Si atom to be substituted by alkyl groups such as —CH$_3$ group and —C$_2$Hs group in the silanol used for preparing the organic SOG.

Each of the inorganic SOG and the organic SOG forms silicon oxide upon calcination, as denoted by the reaction formulas given below. It should be noted, however, that it is possible for a hydrocarbon group to remain in the silicon oxide obtained by using the organic SOG. As a result, the inorganic SOG is generally superior to the organic SOG in the thermal stability.

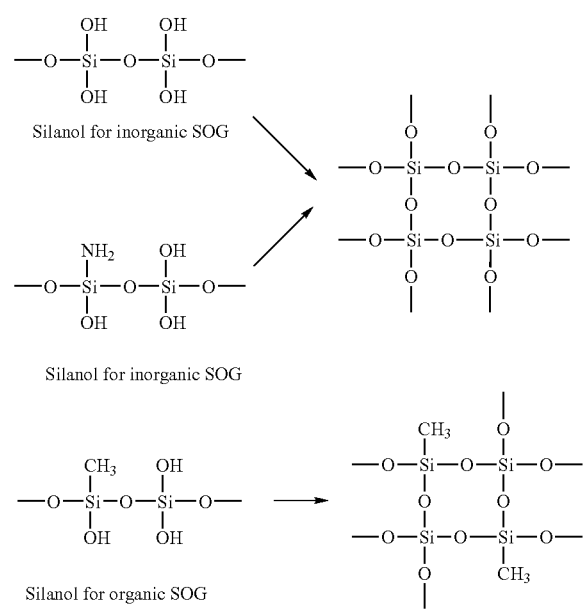

In the fourth embodiment of the present invention, it is possible to set the concentration of the insulating binder 45 in the suspension used for forming the particulate insulating layer 42 to fall within a range of, for example, between 20 and 45% by volume. If the concentration of the insulating binder 45 is excessively low, it is difficult to permit the insulating particles 41 to be bonded to each other via the insulating binder 45 over the entire region of the particulate insulating layer 42. On the other hand, if the concentration of the insulating binder 45 is excessively high, it is difficult for the insulating particles 41 and the insulating binder 45 to form a network structure. In addition, cracks tend to be formed easily in the particulate insulating layer 42 itself. Further, in the case of using, for example, an SOG as a material of the insulating binder 45, the insulating binder 45, if subjected to heat treatment under a high temperature, shrinks by about 5% to 20%. Since the insulating binder 45 is partly bonded to the sidewall and the bottom surface of the trench 3, a difficulty is generated if the concentration of the insulating binder 45 in the particulate insulating layer 42 is excessively high. Specifically, the particulate insulating layer 42 tends to impart an excessively high stress to the semiconductor substrate 2 during the heat treatment under a high temperature. In addition, where the concentration of the insulating binder 45 in the particulate insulating layer 42 is high, it is impossible to completely remove the insulating particles 41 and the insulating binder 45 positioned outside the trench 3 by a CMP treatment.

An experiment was conducted as follows as an example of the fourth embodiment of the present invention. First, the surface of the silicon substrate 2 was coated by a spin coating method with a mixed solution containing a colloidal silica and an inorganic SOG, followed by subjecting the resultant coating film to heat treatment at about 120° C. The mixed solutions used in this stage contained an inorganic SOG in an amount of 20% by volume, 50% by volume and 80% by volume, respectively. As a result, a particulate insulating layer 42 containing the silica particles 41 having an average particle diameter of 0.3 µm and the insulating binder 45 was formed. Then, the silica particles 41 and the insulating binder 45 attached to the outside of the trench 3 were removed by a CMP treatment. The resultant structure was subjected to heat treatment at 1,100° C. for 8 hours under a nitrogen gas atmosphere.

As a result, a defect occurred in the portion of the silicon substrate 2 that is positioned in the vicinity of the trench 3 in the cases where the mixed solutions contained the inorganic SOG in an amount of 50% by volume and 80% by volume, respectively. On the other hand, a defect did not occur in the portion of the silicon substrate 2 that is positioned in the vicinity of the trench 3 in the case where the mixed solutions contained the inorganic SOG in an amount of 20% by volume, although cracks occurred in the particulate insulating layer 42.

A fifth embodiment of the present invention will now be described. The fifth embodiment is substantially equal to the first embodiment described previously, except that the construction described below is employed in the insulating layer 4.

Figure 8:
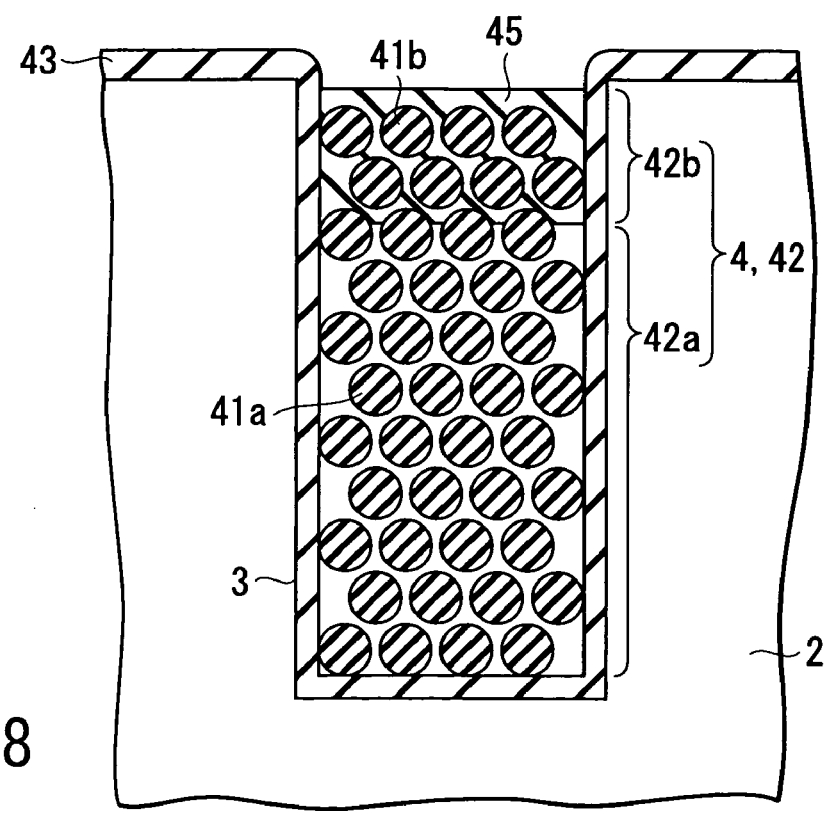
FIG. 8 is a cross-sectional view schematically exemplifying a construction that can be employed in a semiconductor device according to a fifth embodiment of the present invention.

FIG. 8 is a cross-sectional view schematically exemplifying a construction that can be employed in a semiconductor device according to the fifth embodiment of the present invention. In the construction shown in FIG. 8, the insulating layer 4 is formed of a particulate insulating layer 42, which includes first particulate insulating layer 42a and a second particulate insulating layer 42b.

The first particulate insulating layer 42a is formed of the first insulating particles 41a and does not contain a binder. On the other hand, the second particulate insulating layer 42b contains both the second insulating particles 41b and the insulating binder 45.

In the construction described above, the insulating layer 4 includes the first particulate insulating layer 42a that does not contain a binder. As a result, the construction shown in FIG. 8 permits more effectively suppressing the defect generation such as a crack occurrence in the semiconductor substrate 2 caused by the heat treatment, compared with the construction described previously with reference to FIG. 6.

Also, in the construction shown in FIG. 8, the upper surface of the first particulate insulating layer 42a that does not contain a binder is covered with the second particulate insulating layer 42b containing the insulating binder 45. As a result, the second insulating particles 41b are unlikely to be diffused from within the second particulate insulating layer 42b to the outside of the trench 3. In addition, the first insulating particles 41a are also unlikely to be diffused from within the first particulate insulating layer 42a to the outside of the trench 3.

In the fifth embodiment of the present invention, a ratio in thickness of the second particulate insulating layer 42b to the particulate insulating layer 42 is generally small. For example, it is possible to set the thickness of the second particulate insulating layer 42b to fall within a range of about 1 µm to about 5 µm. It follows that it is possible for the insulating particles 41b and the insulating binder 45 to form or not to form a network structure within the second particulate insulating layer 42b.

In the fifth embodiment of the present invention, it is possible for the materials of the first insulating particles 41a and the second insulating particles 41b to be equal to or different from each other.

Also, in the fifth embodiment of the present invention, it is possible for the first insulating particles 41a and the second insulating particles 41b to be equal to or different from each other in the average particle diameter. For example, it is possible for the average particle diameter of the second insulating particles 41b to be smaller than the average particle diameter of the first insulating particles 41a. In other words, it is possible to further combine the technique relating to the third embodiment of the present invention with the fifth embodiment of the present invention.

Also, in the fifth embodiment of the present invention, it is possible for the second particulate insulating layer 42b to contain as the insulating particles 41b both insulating particles having a larger average particle diameter and insulating particles having a smaller average particle diameter. Similarly, it is possible for the first particulate insulating layer 42a to contain as the insulating particles 41a both insulating particles having a larger average particle diameter and insulating particles having a smaller average particle diameter. In other words, it is possible to further combine the technique relating to the second embodiment of the present invention with the fifth embodiment of the present invention.

An experiment was conducted as follows as an example of the fifth embodiment of the present invention. First, the surface of the silicon substrate 2 was coated by a spin coating method with a colloidal silica, followed by heating the resultant coating film so as to remove the dispersion medium from the coating film. Then, the silica particles 41a attached to the outside of the trench 3 were removed by a CMP treatment. As a result, a first particulate insulating layer 42a containing the silica particles 41a having an average particle diameter of 0.3 µm was formed. Next, the surface of the silicon substrate 2 was coated by a spin coating method with a mixed solution containing a colloidal silica and an inorganic SOG, followed by subjecting the resultant coating film to heat treatment at about 120° C. Then, the silica particles 41b and the insulating binder 45 attached to the outside of the trench 3 were removed by a CMP treatment. Incidentally, the mixed solutions used in this stage contained an inorganic SOG in an amount of 20% by volume, 30% by volume, 35% by volume, 45% by volume and 50% by volume, respectively. The resultant structures were subjected to heat treatment at 1,100° C. for 8 hours under a nitrogen atmosphere.

As a result, it was difficult to completely remove the insulating particles 41b and the insulating binder 45 positioned outside the trench 3 by a CMP treatment in each of the cases where the mixed solutions containing an inorganic SOG in an amount of 45% by volume and 50% by volume, respectively, were utilized. On the other hand, in each of the cases where the mixed solutions containing an inorganic SOG in an amount of 20% by volume, 30% by volume and 35% by volume, respectively, were utilized, a defect did not occur in the portion of the silicon substrate 2 that is positioned in the vicinity of the trench 3, although cracks occurred in the particulate insulating layer 42. Further, in the latter cases, the insulating particles 41b and the insulating binder 45 positioned outside the trench 3 could be removed by a CMP treatment. Incidentally, the yield of burying the particulate insulating layer 42 in the trench 3 was found to be 45%, 90%, 90%, and 65% in the cases where the mixed solutions contained the inorganic SOG in an amount of 20% by volume, 30% by volume, 35% by volume and 45% by volume, respectively.

Then, the particulate insulating layer 42 after the heat treatment was observed with an electron microscope. As a result, the silica particles 41 and the insulating binder 45 were found to collectively form a network structure in the particulate insulating layer 42 in the cases where the mixed solutions contained the inorganic SOG in an amount of 20% by weight, 30% by weight, and 35% by weight, respectively. Also, the insulating binder 45 was found to form substantially a continuous phase and the silica particles 41 and the silicon oxide 45 were found to fail to form a network structure in the particulate insulating layer 42 in the cases where the mixed solutions contained the inorganic SOG in an amount of 45% by weight and 50% by weight, respectively.

The techniques according to the first to fifth embodiments of the present invention described above can be employed in combination. Examples of these combinations will be described in conjunction with the additional embodiments of the present invention described in the following.

First of all, a sixth embodiment of the present invention will now be described. The sixth embodiment corresponds to the combination of the first and fourth embodiments described previously.

Figure 9:
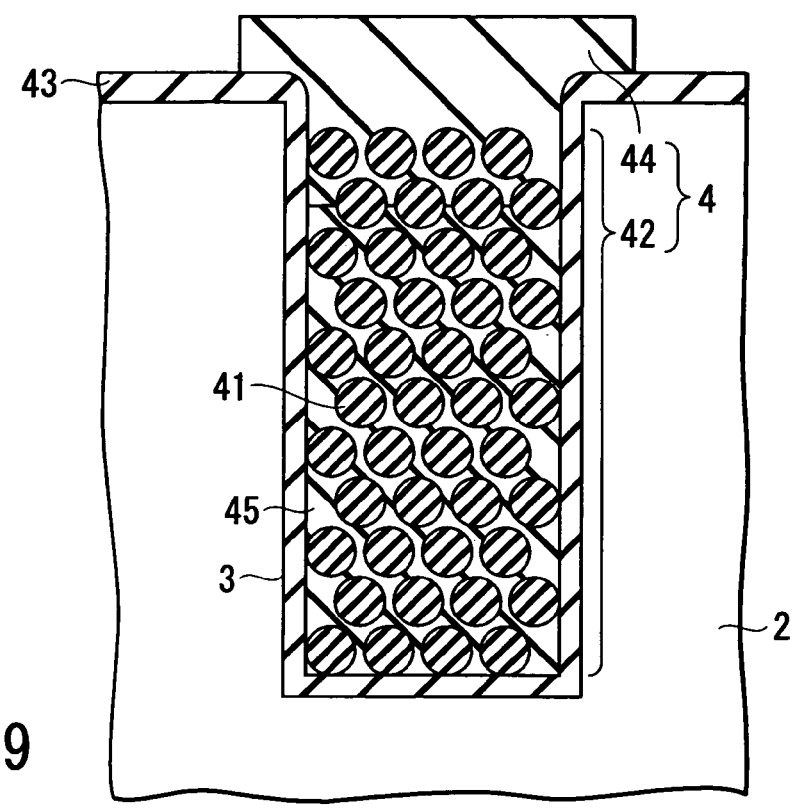
FIG. 9 is a cross-sectional view schematically exemplifying a construction that can be employed in a semiconductor device according to a sixth embodiment of the present invention.

FIG. 9 is a cross-sectional view schematically exemplifying a construction that can be employed in a semiconductor device according to the sixth embodiment of the present invention. In the construction shown in FIG. 9, the insulating layer 4 includes the particulate insulating layer 42 and the reflowable dielectric layer 44. The particulate insulating layer 42 contains the insulating particles 41 and the insulating binder 45 serving to bond these insulating particles 41 to each other.

The construction shown in FIG. 9 permits producing the effect described previously in conjunction with each of the first and fourth embodiments of the present invention. In addition, the particular construction permits preventing without fail the insulating particles 41 from being diffused to the outside of the trench 3 after formation of the reflowable dielectric layer 44.

A seventh embodiment of the present invention will now be described. The seventh embodiment is directed to the combination of the second and fourth embodiments of the present invention described previously.

Figure 10:
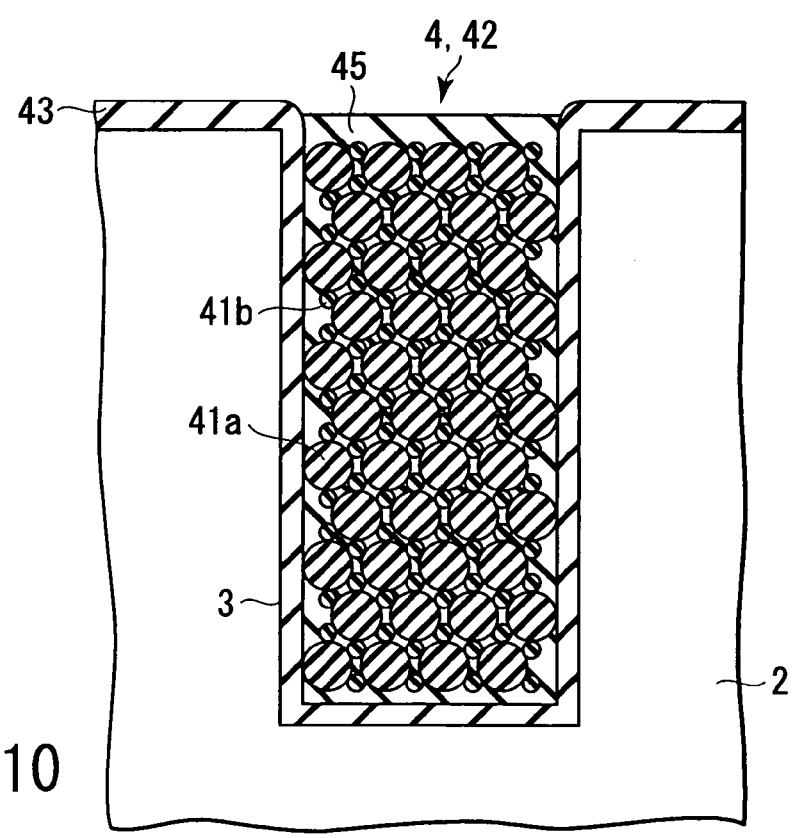
FIG. 10 is a cross-sectional view schematically exemplifying a construction that can be employed in a semiconductor device according to a seventh embodiment of the present invention.

FIG. 10 is a cross-sectional view schematically exemplifying a construction that can be employed in a semiconductor device according to the seventh embodiment of the present invention. In the construction shown in FIG. 10, the insulating layer 4 is formed of the particulate insulating layer 42. The particulate insulating layer 42 contains the first insulating particles 41a and the second insulating particles 41b, which are mixed substantially uniformly, as well as the insulating binder 45 serving to bond these first and second insulating particles 41a and 41b. The particular construction shown in FIG. 10 permits producing the effect described previously in conjunction with each of the second and fourth embodiments of the present invention.

An eighth embodiment of the present invention will now be described. The eighth embodiment corresponds to the combination of the techniques relating to the third and fourth embodiments of the present invention.

Figure 11:
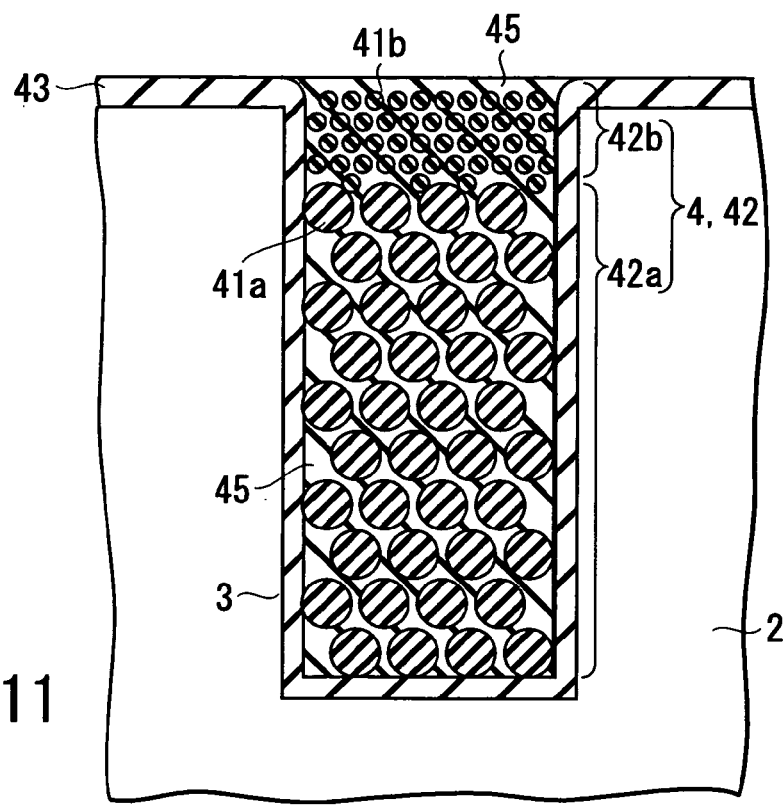
FIG. 11 is a cross-sectional view schematically exemplifying a construction that can be employed in a semiconductor device according to an eighth embodiment of the present invention.

FIG. 11 is a cross-sectional view schematically exemplifying a construction that can be employed in a semiconductor device according to the eighth embodiment of the present invention. In the construction shown in FIG. 11, the insulating layer 4 includes a first particulate insulating layer 42a and a second particulate insulating layer 42b. The first particulate insulating layer 42a contains first insulating particles 41a having a larger particle diameter and an insulating binder 45 serving to bond these first insulating particles 41a to each other. On the other hand, the second particulate insulating layer 42b contains second insulating particles 41b having a smaller particle diameter and an insulating binder 45 serving to bond these second insulating particles 41b to each other. The particular construction permits producing the effect described previously in conjunction with each of the third and fourth embodiments of the present invention. Incidentally, in the eighth embodiment of the present invention, it is possible for the material of the insulating binder 45 contained in the first particulate insulating layer 42a and the material of the insulating binder 45 contained in the second particulate insulating layer 42b to be equal to or different from each other.

A ninth embodiment of the present invention will now be described. The ninth embodiment corresponds to the combination of the techniques relating to the first and fifth embodiments of the present invention described previously.

Figure 12:
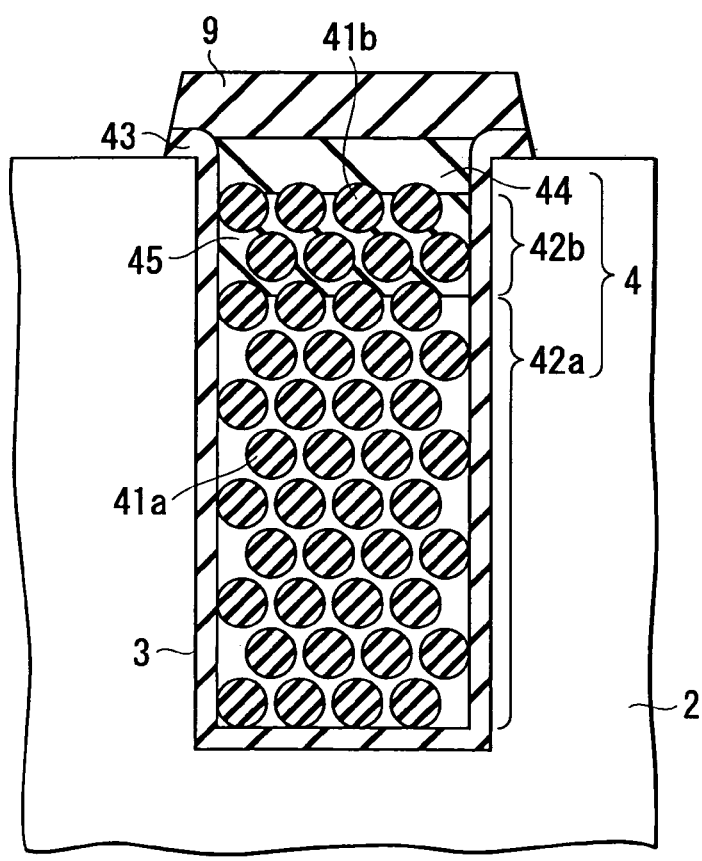
FIG. 12 is a cross-sectional view schematically exemplifying a construction that can be employed in a semiconductor device according to a ninth embodiment of the present invention.

FIG. 12 is a cross-sectional view schematically exemplifying a construction that can be employed in a semiconductor device according to the ninth embodiment of the present invention. In the construction shown in FIG. 12, the insulating layer 4 includes a first particulate insulating layer 42a, a second particulate insulating layer 42b, and a reflowable dielectric layer 44. The first particulate insulating layer 42a is formed of insulating particles 41a. On the other hand, the second particulate insulating layer 42b contains insulating particles 41b and an insulating binder 45.

The particular construction permits producing the effect described previously in conjunction with the first and fifth embodiments of the present invention. Also, in the construction shown in FIG. 12, the second particulate insulating layer 42b containing the insulating particles 41b and the insulating binder 45 is interposed between the reflowable dielectric layer 44 and the first particulate insulating layer 42a. In this case, the reflowable dielectric layer melted or softened by the heat treatment is unlikely to permeate into the second particulate insulating layer 42b, compared with the cases where the second particulate insulating layer 42b does not contain the insulating binder 45. As a result, the construction shown in FIG. 12 permits suppressing the permeation of the melted or softened reflowable dielectric layer 44 into the first particulate insulating layer 42a. In view of the effect of moderating the thermal stress, it is desirable for the contact area between the reflowable dielectric layer 44 and, for example, the insulating particles 41a to be as small as possible. It follows that, in the case of employing the construction shown in FIG. 12, the effect of suppressing the defect generation such as a crack occurrence in the semiconductor substrate 2 is not impaired significantly even if, for example, the heat treatment is carried out a plurality of times.

In the construction shown in FIG. 12, the reflowable dielectric layer 44 is covered with a cap insulating layer 9. The cap insulating layer 9 has a melting point or a softening point higher than that of the reflowable dielectric layer 44. In the typical case, the melting point or the softening point of the cap insulating layer 9 is higher than the highest temperature in the heat treatment carried out after formation of the particulate insulating layer 42.

In the construction shown in FIG. 12, the reflowable dielectric layer 44 is surrounded by the barrier insulating layer 43 and the cap insulating layer 9. As a result, it is possible to suppress the diffusion of the elements contained in the reflowable dielectric layer 44 into, for example, the semiconductor substrate 2.

The material of the cap insulating layer 9 is not particularly limited as far as the conditions described above in respect of the melting point or the softening are satisfied. The materials of the cap insulating layer 9 satisfying the conditions referred to above include, for example, an oxide such as silicon oxide, nitrides such as silicon nitride, and a mixture thereof.

In the construction shown in FIG. 12, the barrier insulating layer 43 is patterned in a shape substantially equal to that of the cap insulating layer 9. The particular construction can be obtained by, for example, etching the barrier insulating layer 43 in the etching step for patterning the cap insulating layer 9, or by performing the etching of the barrier insulating layer 9 with the cap insulating layer 9 used as a mask.

The sixth to ninth embodiments correspond to combinations between at least one of the techniques relating to the first to third embodiments and the techniques relating to the fourth or fifth embodiment of the present invention. Still other combinations of the techniques relating to the first to fifth embodiments are contemplated. For example, it is possible to combine the technique relating to the first embodiment of the present invention with the technique relating to the second or third embodiment of the present invention. Also, in the construction shown in FIG. 12, it is possible to omit at least one of the cap insulating layer 9 and the reflowable dielectric layer 44. Further, it is possible to use the cap insulating layer 9 described in conjunction with the ninth embodiment of the present invention in a semiconductor device according to another embodiment of the present invention.

A tenth embodiment of the present invention will now be described.

Figure 13:
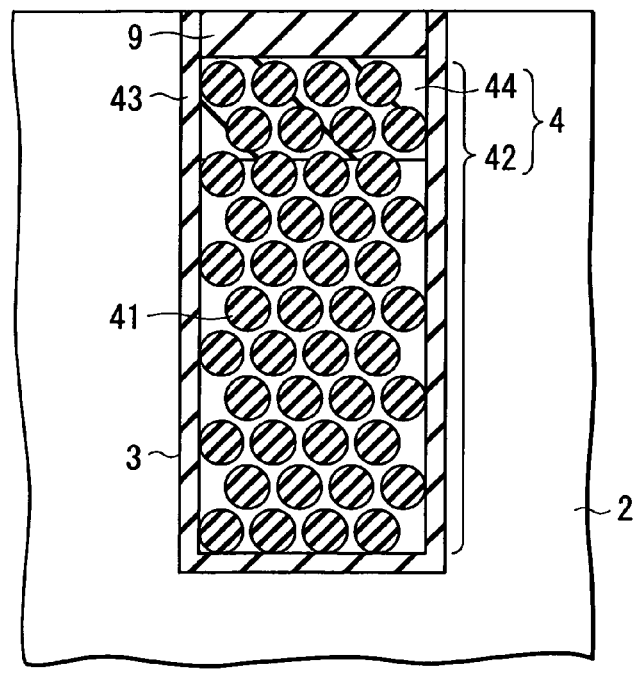
FIG. 13 is a cross-sectional view schematically exemplifying a construction that can be employed in a semiconductor device according to a tenth embodiment of the present invention.

FIG. 13 is a cross-sectional view schematically exemplifying a construction that can be employed in a semiconductor device according to the tenth embodiment of the present invention.

In the construction shown in FIG. 13, the insulating layer 4 includes a particulate insulating layer 42 composed of insulating particles 41, and a reflowable dielectric layer 44, as in the construction shown in FIG. 3. Therefore, if the construction shown in FIG. 13 is employed, the same advantages as those obtained when the construction shown in FIG. 3 is employed can be obtained.

Further, in the construction shown in FIG. 13, the reflowable dielectric layer 44 is covered with a cap insulating layer 9, as in the construction shown in FIG. 12. Therefore, if the construction shown in FIG. 13 is employed, it is possible to suppress the diffusion of the elements contained in the reflowable dielectric layer 44 into, for example, the semiconductor substrate 2, as in the case where the construction shown in FIG. 12 is employed.

Figure 14:
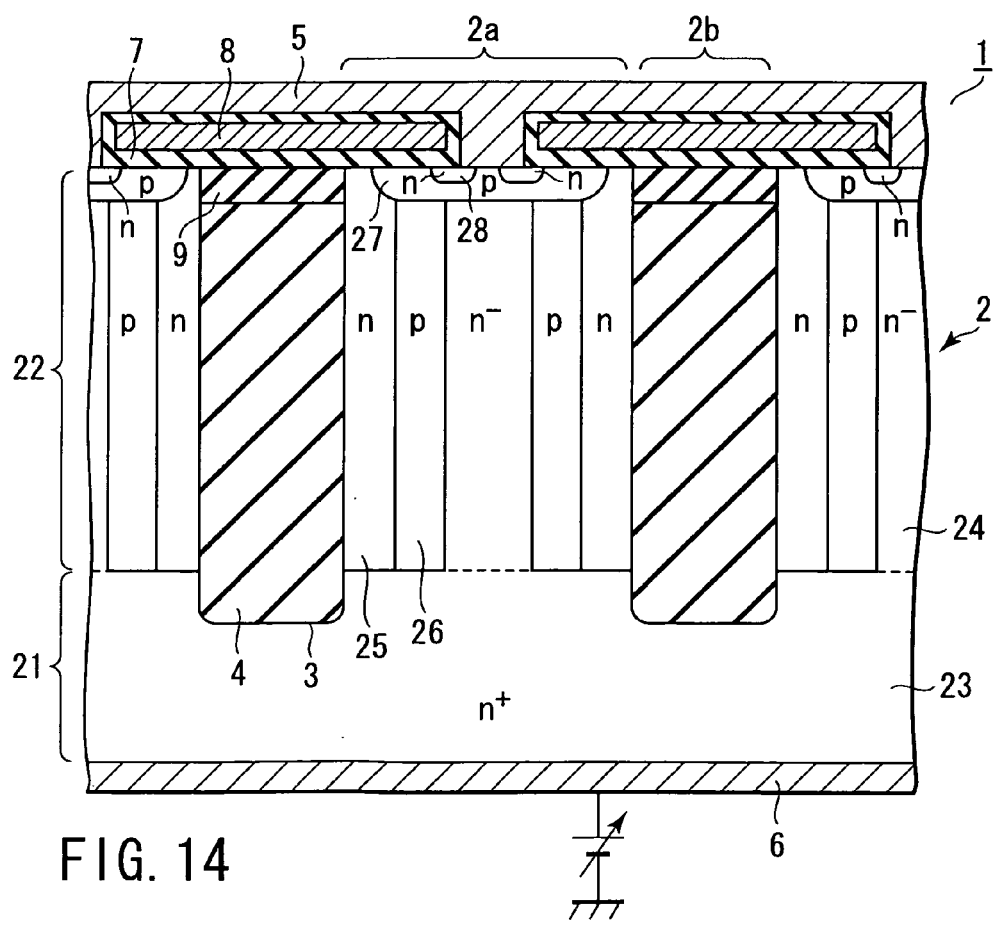
FIG. 14 is a cross-sectional view schematically exemplifying a semiconductor device that employs the construction shown in FIG. 13.

Furthermore, in the construction shown in FIG. 13, an upper surface of the cap insulating layer 9 is substantially flush with an upper surface of the semiconductor substrate 2. Therefore, in the case where the construction shown in FIG. 13 is employed in the semiconductor device 1, a flat gate electrode 8 is formed as shown in FIG. 14. If the gate electrode 8 is flat in this fashion, a higher withstand voltage can be achieved as described below.

Figure 15:
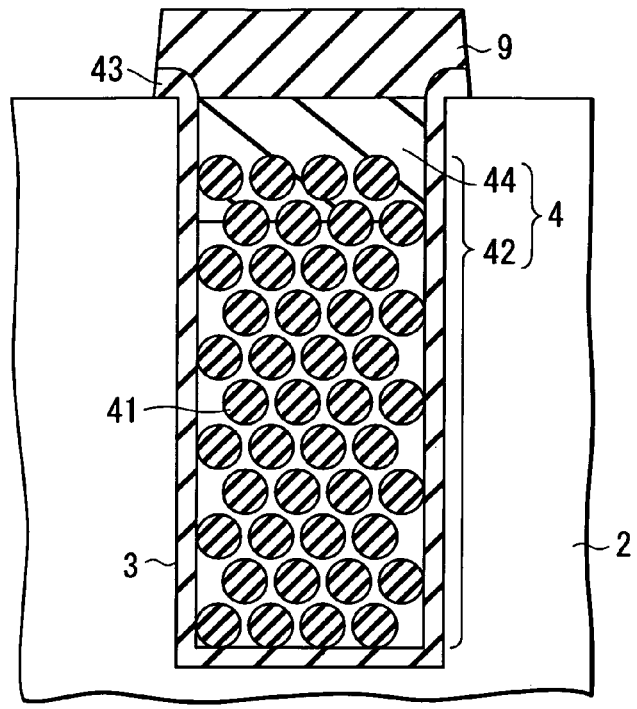
FIG. 15 is a cross-sectional view schematically exemplifying a modification of the construction shown in FIG. 13.
Figure 16:
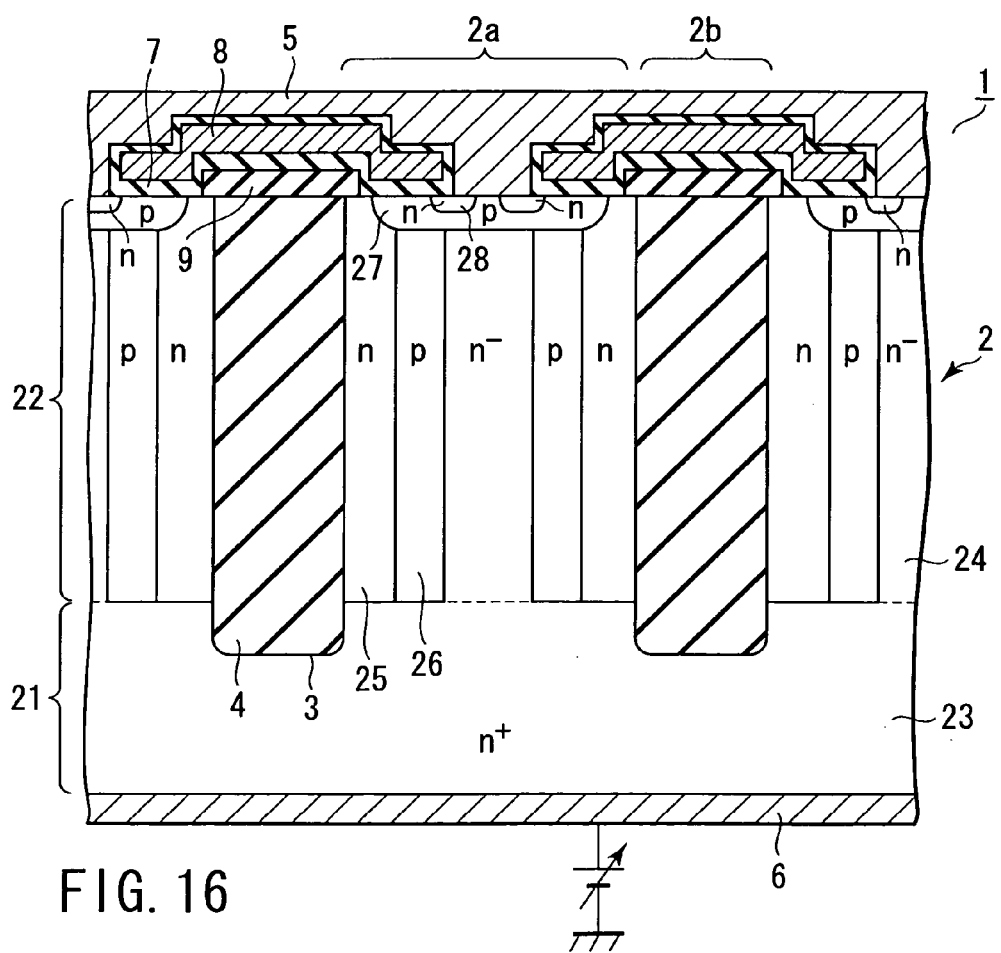
FIG. 16 is a cross-sectional view schematically exemplifying a semiconductor device that employs the construction shown in FIG. 15.

FIG. 15 is a cross-sectional view schematically exemplifying a modification of the construction shown in FIG. 13. FIG. 16 is a cross-sectional view schematically exemplifying a semiconductor device that employs the construction shown in FIG. 15.

In the construction shown in FIG. 15, the position of the upper surface of the cap insulating layer 9 is higher than the position of the upper surface of the semiconductor substrate 2. Therefore, in the case where the construction shown in FIG. 15 is employed in the semiconductor device 1, a terraced gate electrode 8 is formed as shown in FIG. 16.

The equipotential surface of the electric field produced by the terraced gate electrode 8 is distorted as compared to that of the electric field produced by the flat gate electrode 8. From the point of view of withstand voltage, it is advantageous if the distortion of the equipotential surface is small. Thus, if the construction shown in FIG. 13 is employed, a higher withstand voltage can be achieved as compared to the case where the construction shown in FIG. 15 is employed.

The construction shown in FIG. 13 can be obtained by, for example, the following method.

FIGS. 17 to 19 are cross-sectional views schematically exemplifying a method for forming the construction shown in FIG. 13.

In this method, first, the same process as that described with reference to FIG. 3 in the first embodiment is carried out. Next, the reflowable dielectric layer 44 is heated as needed. If the reflowable dielectric layer 44 is heated to a proper degree, part of the reflowable dielectric layer 44 mixes easily with the insulating particles 41 in an upper portion of the particulate insulating layer 42. As a result, the construction shown in FIG. 17 is obtained.

Next, the part of the reflowable dielectric layer 44 positioned outside the trench 3 is removed by a CMP. In addition, the reflowable dielectric layer 44 is etched back. The reflowable dielectric layer 44 is etched back until, for example, an upper surface of the reflowable dielectric layer 44 is substantially flush with an upper surface of the particulate insulating layer 42. As a result, a shallow recess is formed in the surface of the semiconductor substrate 2 at the position of the trench 3 as shown in FIG. 18.

Next, the recess is filled with the cap insulating layer 9 as shown in FIG. 19. Further, the part of the cap insulating layer 9 positioned outside the trench 3 is removed by a CMP. By the above-described method, the construction shown in FIG. 13 is obtained.

The construction described in the tenth embodiment, i.e., the construction in which the upper surface of the cap insulating layer 9 is substantially flush with the upper surface of the semiconductor substrate 2, can be employed also in semiconductor devices 1 according to the first to ninth embodiments and the combinations thereof. If employed, a higher withstand voltage can be achieved in addition to the advantages described in each embodiment. It should be noted that the advantage of a higher withstand voltage can be obtained even in the case where the reflowable dielectric layer 44 is omitted from the construction shown in FIG. 13.

Also, the trench isolating technique applied to the semiconductor device shown in FIG. 1 can be applied to a semiconductor device of another construction. For example, the trench isolating technique described previously can be applied to a semiconductor device with a MOSFET of the construction differing from that shown in FIG. 1. Alternatively, the trench isolating technique described previously can be applied to a semiconductor device with, for example, a bipolar transistor.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
    a semiconductor substrate with a trench, the semiconductor substrate comprising a first semiconductor layer of a first conductivity type and a second semiconductor layer disposed above the first semiconductor layer, and the second semiconductor layer including
        a first impurity diffusion region of the first conductivity type,
        a second impurity diffusion region of a second conductivity type, the second impurity diffusion region and the trench sandwiching the first impurity diffusion region,
        a base region of the second conductivity type which faces the first semiconductor layer with the first and second impurity diffusion regions interposed therebetween and is spaced apart from the trench, and
        a source region of the first conductivity type which faces the first semiconductor layer with the base region and the second impurity diffusion region interposed therebetween and is spaced apart from the first impurity diffusion region;
    a particulate insulating layer filling at least a lower portion of the trench and comprising insulating particles, wherein an average diameter of the insulating particles falls within a range of 100 nm to 500 nm or a range of 100 nm to half a width of opening of the trench;
    a reflowable dielectric layer covering an upper surface of the particulate insulating layer, the insulating particles being stable at a melting point or a softening point of the reflowable dielectric layer;
    a gate electrode facing a portion of the base region interposed between the first impurity diffusion region and the source region;
    a gate insulating film interposed between the gate electrode and the base region;
    a source electrode covering the source region; and
    a drain electrode covering the first semiconductor layer, the drain and source electrodes sandwiching the semiconductor substrate.

2. The device according to claim 1, wherein the reflowable dielectric layer comprises silicate glass doped with impurity.

3. The device according to claim 1, further comprising a barrier insulating layer on a sidewall and a bottom surface of the trench.

4. The device according to claim 1, further comprising a cap insulating layer covering an upper surface of the reflowable dielectric layer and having a melting point or a softening point higher than the melting point or the softening point of the reflowable dielectric layer.

5. The device according to claim 1, wherein the particulate insulating layer further comprises an insulating binder.

6. The device according to claim 1, wherein an upper surface of the particulate insulating layer is lower than an upper surface of the semiconductor substrate.

7. The device according to claim 4, wherein an upper surface of the cap insulating layer is flush with an upper surface of the semiconductor substrate.

8. The device according to claim 3, wherein the barrier insulating layer is made of a material selected from the group consisting of silicon oxide, silicon nitride, and a mixture thereof.

9. A semiconductor device, comprising:
    a semiconductor substrate with a trench; and
    a particulate insulating layer filling at least a lower portion of the trench and comprising first and second insulating particles, an average diameter of the second insulating particles being smaller than an average diameter of the first insulating particles,
    wherein the first insulating particles form a first particulate insulating layer, and the second insulating particles form a second particulate insulating layer covering an upper surface of the first particulate insulating layer.

10. The device according to claim 9, further comprising a barrier insulating layer on a sidewall and a bottom surface of the trench.

11. The device according to claim 9, further comprising a reflowable dielectric layer covering an upper surface of the particulate insulating layer, the first and second insulating particles being stable at a melting point or a softening point of the reflowable dielectric layer.

12. The device according to claim 11, further comprising a cap insulating layer covering an upper surface of the reflowable dielectric layer and having a melting point or a softening point higher than the melting point or the softening point of the reflowable dielectric layer.

13. The device according to claim 9, wherein the particulate insulating layer further comprises an insulating binder.

14. The device according to claim 9, wherein the average diameter of the first insulating particles and the average diameter of the second insulating particles fall within a range of 100 nm to 500 nm or a range of 100 nm to haifa width of opening of the trench.

15. The device according to claim 10, wherein the barrier insulating layer is made of a material selected from the group consisting of silicon oxide, silicon nitride, and a mixture thereof.

16. The device according to claim 9, wherein the semiconductor substrate comprises a first semiconductor layer of a first conductivity type, and a second semiconductor layer disposed above the first semiconductor layer, the second semiconductor layer including:
  a first impurity diffusion region of the first conductivity type;
  a second impurity diffusion region of a second conductivity type, the second impurity diffusion region and the trench sandwiching the first impurity diffusion region;
  a base region of the second conductivity type which faces the first semiconductor layer with the first and second impurity diffusion regions interposed therebetween and is spaced apart from the trench; and
  a source region of the first conductivity type which faces the first semiconductor layer with the base region and the second impurity diffusion region interposed therebetween and is spaced apart from the first impurity diffusion region,
wherein the device further comprises:
  a gate electrode facing a portion of the base region interposed between the first impurity diffusion region and the source region;
  a gate insulating film interposed between the gate electrode and the base region;
  a source electrode covering the source region; and
  a drain electrode covering the first semiconductor layer, the drain and source electrodes sandwiching the semiconductor substrate.

17. A semiconductor device, comprising:
a semiconductor substrate with a trench, the semiconductor substrate comprising a first semiconductor layer of a first conductivity type and a second semiconductor layer disposed above the first semiconductor layer, and the second semiconductor layer including
  a first impurity diffusion region of the first conductivity type,
  a second impurity diffusion region of a second conductivity type, the second impurity diffusion region and the trench sandwiching the first impurity diffusion region,
  a base region of the second conductivity type which faces the first semiconductor layer with the first and second impurity diffusion regions interposed therebetween and is spaced apart from the trench, and
  a source region of the first conductivity type which faces the first semiconductor layer with the base region and the second impurity diffusion region interposed therebetween and is spaced apart from the first impurity diffusion region;
a particulate insulating layer filling at least a lower portion of the trench and comprising insulating particles and an insulating binder that bonds the insulating particles together, the insulating particles and the insulating binder forming a network structure, wherein an average diameter of the insulating particles falls within a range of 100 nm to 500 nm or a range of 100 nm to haifa width of opening of the trench;
a gate electrode facing a portion of the base region interposed between the first impurity diffusion region and the source region;
a gate insulating film interposed between the gate electrode and the base region;
a source electrode covering the source region; and
a drain electrode covering the first semiconductor layer, the drain and source electrodes sandwiching the semiconductor substrate.

18. The device according to claim 17, further comprising a barrier insulating layer on a sidewall and a bottom surface of the trench.

19. The device according to claim 18, wherein the barrier insulating layer is made of a material selected from the group consisting of silicon oxide, silicon nitride, and a mixture thereof.

20. A semiconductor device, comprising:
a semiconductor substrate with a trench; and
a particulate insulating layer filling at least a lower portion of the trench and including first and second particulate insulating layers, the first particulate insulating layer comprising first insulating particles with no binder, and the second particulate insulating layer covering an upper surface of the first particulate insulating layer and comprising second insulating particles and an insulating binder.

21. The device according to claim 20, further comprising a barrier insulating layer on a sidewall and a bottom surface of the trench.

22. The device according to claim 20, further comprising a reflowable dielectric layer covering an upper surface of the second particulate insulating layer, the first and second insulating particles being stable at a melting point or a softening point of the reflowable dielectric layer.

23. The device according to claim 22, further comprising a cap insulating layer covering an upper surface of the reflowable dielectric layer and having a melting point or a softening point higher than the melting point or the softening point of the reflowable dielectric layer.

24. The device according to claim 20, wherein an average diameter of the first and second insulating particles falls within a range of 100 nm to 500 nm or a range of 100 nm to half a width of opening of the trench.

25. The device according to claim 21, wherein the barrier insulating layer is made of a material selected from the group consisting of silicon oxide, silicon nitride, and a mixture thereof.

26. The device according to claim 20, wherein the semiconductor substrate comprises a first semiconductor layer of a first conductivity type, and a second semiconductor layer disposed above the first semiconductor layer, the second semiconductor layer including:
  a first impurity diffusion region of the first conductivity type;
  a second impurity diffusion region of a second conductivity type, the second impurity diffusion region and the trench sandwiching the first impurity diffusion region;
  a base region of the second conductivity type which faces the first semiconductor layer with the first and second impurity diffusion regions interposed therebetween and is spaced apart from the trench; and
  a source region of the first conductivity type which faces the first semiconductor layer with the base region and the second impurity diffusion region interposed therebetween and is spaced apart from the first impurity diffusion region,
wherein the device further comprises:
  a gate electrode facing a portion of the base region interposed between the first impurity diffusion region and the source region;
  a gate insulating film interposed between the gate electrode and the base region;
  a source electrode covering the source region; and
  a drain electrode covering the first semiconductor layer, the drain and source electrodes sandwiching the semiconductor substrate.

* * * * *